(12) United States Patent
Kawashima et al.

(10) Patent No.: US 8,481,993 B2
(45) Date of Patent: Jul. 9, 2013

(54) SEMICONDUCTOR COMPOSITE FILM, METHOD FOR FORMING SEMICONDUCTOR COMPOSITE FILM, THIN FILM TRANSISTOR, METHOD FOR MANUFACTURING THIN FILM TRANSISTOR, AND ELECTRONIC APPARATUS

(75) Inventors: Noriyuki Kawashima, Kanagawa (JP); Takahiro Ohe, Tokyo (JP)

(73) Assignee: Sony Corporation, Tokyo (JP)

( * ) Notice: Subject to any disclaimer, the term of this patent is extended or adjusted under 35 U.S.C. 154(b) by 52 days.

(21) Appl. No.: 12/502,606

(22) Filed: Jul. 14, 2009

(65) Prior Publication Data

US 2010/0019233 A1  Jan. 28, 2010

(30) Foreign Application Priority Data

Jul. 24, 2008 (JP) ................. 2008-190602

(51) Int. Cl.
| | |
|---|---|
| H01L 35/24 | (2006.01) |
| H01L 51/00 | (2006.01) |
| H01L 23/58 | (2006.01) |
| H01L 23/48 | (2006.01) |
| H01L 29/40 | (2006.01) |

(52) U.S. Cl.
USPC ............ 257/40; 257/642; 257/643; 257/759; 438/82; 438/149

(58) Field of Classification Search
USPC ................ 257/40, 66, 642, 643, 759; 438/82, 438/99, 149, 725, 780
See application file for complete search history.

(56) References Cited

U.S. PATENT DOCUMENTS

| | | | | |
|---|---|---|---|---|
| 7,855,097 B2 * | 12/2010 | Dimmler | .......................... | 438/99 |
| 2005/0221530 A1 * | 10/2005 | Cheng et al. | ..................... | 438/82 |
| 2006/0214252 A1 * | 9/2006 | Hirai et al. | ..................... | 257/462 |
| 2007/0102696 A1 | 5/2007 | Brown et al. | | |
| 2007/0126002 A1 * | 6/2007 | Moriya et al. | .................. | 257/40 |
| 2007/0215957 A1 * | 9/2007 | Chen et al. | ..................... | 257/411 |
| 2009/0014716 A1 * | 1/2009 | Yamaga et al. | ................. | 257/40 |

FOREIGN PATENT DOCUMENTS

| | | |
|---|---|---|
| JP | 2002-110999 | 4/2002 |
| JP | 2005-243822 | 9/2005 |
| JP | 2006-179905 | 7/2006 |
| JP | 2007-519227 | 7/2007 |
| WO | 2006/098416 | 9/2006 |

OTHER PUBLICATIONS

Japanese Office Action issued on Jan. 13, 2011 in connection with counterpart JP Application No. 2008-190602.
Christopher W. Sele et al.; Lithography-Free, Self-Aligned Inkjet Printing with Sub-Hundred-Nanometer Resolution; Advanced Materials; 2005; 17, No. 8, Apr. 18.
A. C. Arias et al.; All jet-printed polymer thin-film transistor active-matrix backplanes; Applied Physics Letters; vol. 85, No. 15; Oct. 11, 2004.
Dae Ho Song et al.; Process optimization of organic thin-film transistor by ink-jet printing of DH4T on plastic; Applied Physics Letters 90, 053504; 2007.

* cited by examiner

*Primary Examiner* — Chuong A. Luu
(74) *Attorney, Agent, or Firm* — Dentons US LLP

(57) ABSTRACT

A semiconductor composite film includes a semiconductor thin film layer containing an organic semiconductor material, an insulating thin film layer formed from a polymer material phase-separated from the organic semiconductor material in the film thickness direction, and a fine particle material dispersed in at least one of the semiconductor thin film layer and the insulating thin film layer.

5 Claims, 4 Drawing Sheets

- • a
- ▨ b
- ○ d

SEMICONDUCTOR COMPOSITE FILM, METHOD FOR FORMING SEMICONDUCTOR COMPOSITE FILM, THIN FILM TRANSISTOR, METHOD FOR MANUFACTURING THIN FILM TRANSISTOR, AND ELECTRONIC APPARATUS

BACKGROUND OF THE INVENTION

1. Field of the Invention

The present invention relates to a semiconductor composite film provided with an organic semiconductor thin film, a method for forming the semiconductor composite film, a thin film transistor including the semiconductor composite film, a method for manufacturing the thin film transistor, and an electronic apparatus.

2. Description of the Related Art

An organic thin film transistor (OTFT) can be formed by a process at temperatures lower than those for an amorphous silicon TFT or a low-temperature polysilicon TFT in the related art and, therefore, is formed on even a flexible plastic substrate having the bendability with no stress. Consequently, development in thin displays and other various new applications is expected. Furthermore, since a substrate can be formed by an inexpensive process, e.g., coating or printing, through the use of a coating material soluble into a solvent without using a vacuum process or photolithography, a reduction in cost is expected.

Regarding pattern printing of an organic semiconductor thin film in OTFT production, the use of a polymer based organic semiconductor material is advantageous from the viewpoint of the printability. For example, regarding the formation of an organic semiconductor thin film layer by an ink-jet method, there are many reports and polymer based organic semiconductor materials, e.g., poly(9,9-dioctylfluorene-co-bithiophene) (F8T2) (refer to C. W. Sele et al., Advanced Materials Vol. 17, p. 997 (2005)) and poly(5,5'-bis (3-dodecyl-2-thienyl)-2,2'-bithiophene) (PQT-12) (refer to A. C. Arias et al., Applied Physics Letters vol. 85, p. 3304 (2004)), have been used.

On the other hand, in consideration of the characteristics of the organic semiconductor thin film itself, the use of low-molecular organic semiconductor material is advantageous. For example, regarding the organic semiconductor thin film formed by applying a spin coating method or other coating methods, in the case where the high-molecular organic semiconductor material is used, the mobility is no more than about 0.1 $cm^2/Vs$. On the other hand, in the case where the low-molecular organic semiconductor material is used, there are many reports in which the mobility exceeds 1 $cm^2/Vs$. J. Jang et al. applied a dichlorobenzene solution of dihexyl quarter thiophene (DH4T) serving as a low-molecular organic semiconductor material by an ink-jet method so as to produce a bottom gate type OTFT and, thereby, achieved the mobility of 0.043 $cm^2/Vs$. However, accurate control of the parameters, e.g., a substrate temperature, is desired, and it is expected that instability of film formation due to a coffee stain phenomenon and the like and characteristic variations and the like resulting therefrom become problems.

Consequently, a technique for pattern-printing an organic semiconductor thin film with good film-quality controllability, even when a low-molecular organic semiconductor material is used, is desired.

Under the circumstances, a polymer blend method has been proposed, in which an organic semiconductor thin film is formed by using a polymer material together with a semiconductor material.

In the polymer blend method, for example, pattern printing is conducted by using an ink in which an insulating polymer material is polymer-blended to a low-molecular organic semiconductor material, and the organic semiconductor material and the polymer material are phase-separated in the film thickness direction. At this time, a technique for facilitating the phase separation through surface energy control of the substrate has been reported, and a thin film transistor operation through the use of the semiconductor thin film layer formed by this technique has been ascertained (refer to Japanese Unexamined Patent Application Publication No. 2005-243822 and Japanese Unexamined Patent Application Publication No. 2006-179905).

Furthermore, regarding such a polymer blend method, it is described that the charge mobility is increased and the stability of the semiconductor thin film layer is improved by polymer-blending a binder resin to a low-molecular semiconductor material of acene base or the like (refer to Japanese Unexamined Patent Application Publication (Translation of PCT Application) No. 2007-519227).

Regarding the above-described polymer blend method accompanying phase separation, further uniform film formation is expected. That is, in the case of fine droplets formed by, for example, application through ink-jet, Marangoni convection resulting from surface tension distribution occurs during drying of a solvent and, thereby, film formation variation occurs easily because of solute transport. However, the polymer blend method has effects of restricting such solute transport and improving the wettability with the substrate. Consequently, uniform film formation is facilitated.

Moreover, the polymer blend method also has an advantage that the ink viscosity is improved. Therefore, application to pattern printing, in which not only the ink-jet method, but also a high-throughput printing technique, e.g., screen printing or gravure printing, is applied, of an organic semiconductor thin film is also expected.

SUMMARY OF THE INVENTION

However, as for the viscosity of the ink used for the above-described high-throughput printing method, for example, 10,000 mPa·s or more is desired in the screen printing, and about 500 mPa·s is desired in the gravure printing. Consequently, in order to improve the viscosity in the above-described polymer blend method, it is desired to increase the concentration of the polymer material contained in the ink. Therefore, in the case where the low-molecular organic semiconductor material is used, the proportion of the polymer material increases inevitably.

FIG. 5 is a binary diagram of a polymer alloy. In general, regarding a two-component system polymer alloy, whether phase separation occurs or not is determined depending on the magnitude of the interaction parameter of Flory-Huggins. Consequently, in the inside of the spinodal curve α, phase separation without nucleation proceeds and phase separation in the film thickness direction results. On the other hand, phase separation with nucleation and growth proceeds between the spinodal curve α and the binodal curve β, but phase separation in the film thickness direction does not result. Furthermore, phase separation does not occur outside the binodal curve β.

Therefore, in the case where, for example, a polymer material A and an organic semiconductor material B are used and the ratio of organic semiconductor material B/polymer material A is specified to be x1 in such a way as to ensure the viscosity suitable for improving the printability, the state of the two components becomes outside the binodal curve β and, therefore, the phase separation phenomenon is not exhibited. That is, the phase separation phenomenon is not exhibited unless the ratio of organic semiconductor material B/polymer material A is specified to be, for example, x2 within the range of the spinodal curve α.

Furthermore, in the case of the screen printing, total rheology control including not only the viscosity, but also the thixotropy is indispensable and, therefore, it becomes difficult to prepare an ink having a desired viscosity merely by polymer blend. That is, regarding the polymer blend methods by using the organic semiconductor material and the polymer material described in the above-described patent documents, it is very difficult that the printability in the high-throughput printing method, e.g., screen printing or gravure printing, and the phase separation state of the film resulting from the printing become mutually compatible.

Accordingly, it is desirable to provide a semiconductor composite film having good printing characteristics and ease of phase state controllability of the resulting film and a method for forming the semiconductor composite film, as well as a thin film transistor, a method for manufacturing a thin film transistor, and an electronic apparatus, which include the semiconductor composite film.

A semiconductor composite film according to an embodiment of the present invention includes a semiconductor thin film layer containing an organic semiconductor material, an insulating thin film layer formed from a polymer material phase-separated from the above-described organic semiconductor material in the film thickness direction, and a fine particle material dispersed in at least one of the semiconductor thin film layer and the insulating thin film layer.

A method for forming a semiconductor composite film according to an embodiment of the present invention includes the steps of preparing an ink in which an organic semiconductor material and a polymer material different from the organic semiconductor material are dissolved into a solvent and, in addition, a fine particle material is dispersed into the solvent, forming a material layer including the ink on a substrate by a printing method, and forming a semiconductor composite film, in which a semiconductor thin film layer containing the organic semiconductor material and an insulating thin film layer containing the polymer material are laminated and, in addition, the fine particle material is dispersed, by removing the solvent in the material layer so as to phase-separate the organic semiconductor material and the polymer material in the material layer in the film thickness direction and effect solidification.

In the above-described configuration, the organic semiconductor material and the polymer material are phase-separated from each other and, in addition, the fine particle material is dispersed. Consequently, it is possible that the phase separation is controlled by the content ratio of the semiconductor material to the polymer material, and the viscosity and the thixotropy of the ink for the film formation are favorably controlled by the amount of dispersion of the fine particle material.

A thin film transistor according to an embodiment of the present invention includes a semiconductor thin film layer which is disposed on a substrate and which contains an organic semiconductor material, an insulating thin film layer which is formed from a polymer material phase-separated from the organic semiconductor material in the film thickness direction and which constitutes the semiconductor composite film together with the semiconductor thin film layer, a fine particle material dispersed in at least one of the semiconductor thin film layer and the insulating thin film layer, and a source electrode and a drain electrode disposed between the semiconductor thin film layer in the semiconductor composite film and the substrate. An electronic apparatus according to an embodiment of the present invention includes a semiconductor composite film provided with a semiconductor thin film layer containing an organic semiconductor material, an insulating thin film layer formed from a polymer material phase-separated from the organic semiconductor material in the film thickness direction, and a fine particle material dispersed in at least one of the semiconductor thin film layer and the insulating thin film layer.

As described above, according to an embodiment of the present invention, it is possible that the phase separation is controlled by the content ratio of the semiconductor material to the polymer material, and the viscosity and the thixotropy of the ink for the film formation is favorably controlled by the amount of dispersion of the fine particle material. Consequently, regarding the film which has the viscosity and the thixotropy suitable for good printability and which is formed through printing with good precision of shape, the semiconductor composite film in which the semiconductor material and the polymer material are phase-separated reliably can be obtained.

DESCRIPTION OF THE PREFERRED EMBODIMENTS

The embodiments of the present invention will be described below in the order of a semiconductor composite film, a thin film transistor, and an electronic apparatus with reference to the drawings. In this regard, in the individual embodiments, the explanations are made in the order of production steps.

Semiconductor Composite Film

Figure 1A:
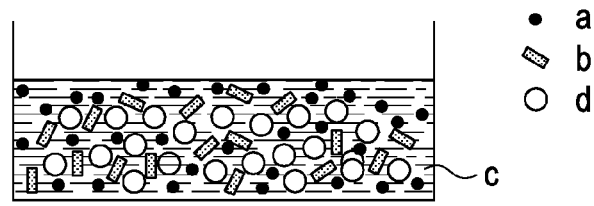
FIGS. 1A to 1C are diagrams for explaining formation of a semiconductor composite film according to an embodiment of the present invention.

Initially, as shown in FIG. 1A, in the preparing an ink, an organic semiconductor material a and a polymer material b are dissolved into a solvent c and, in addition, a fine particle material d is dispersed into the solvent c, so that an ink 3 for printing is prepared. The individual materials used here are as described below.

Organic Semiconductor Material a

As for the organic semiconductor material a, a low-molecular organic semiconductor material or a polymer based organic semiconductor material is used.

As for the low-molecular organic semiconductor material, 6,13-bis(triisopropyl-silylethynyl)pentacene (TIPS pentacene) and other pentacene derivatives, anthradithiophene derivatives, rubrene derivatives, thiophene oligomer derivatives, naphthacene derivatives, anthracene derivatives, porphyrin derivatives, phthalocyanine derivatives, and the like, which can be applied through coating, are used.

Furthermore, as for the polymer based organic semiconductor material, polythiophenes and derivatives thereof, polyphenylvinylene and derivatives thereof, fluorenethiophene copolymers, polyallylamines and derivatives thereof, and the like are used.

As for the above-described organic semiconductor material a, at least two different types of materials may be used in combination. Moreover, as for the organic semiconductor material a, materials may be selected and used in such a way that the semiconductor thin film layer in the semiconductor composite film formed here has desired characteristics. For example, in the case where it is desired to ensure the carrier mobility of the semiconductor thin film layer, low-molecular organic semiconductor material a, e.g., TIPS pentacene, is used preferably.

Polymer Material b

As for the polymer material b, an insulating material is selected and used. For example, selection can be conducted from polystyrenes, polymethyl methacrylates, polyethylenes, polypropylenes, polybutadienes, polyisoprenes, polyolefins, polycarbonates, polyimides, polyamides, poly($\alpha$-methylstyrene), poly($\alpha$-ethylstyrene), poly($\alpha$-propylstyrene), poly($\alpha$-butylstyrene), poly(4-methylstyrene), polyacrylonitriles, polyvinylcarbazoles, polyvinylidene fluorides, polyvinyl butyrals, polyvinyl toluenes, poly(4-vinylbiphenyl), and copolymers of the above-described polymers.

Among them, materials having high solubility in the same solvent as that of the organic semiconductor material a is used preferably as the polymer material b. Consequently, in the case where TIPS pentacene is used as the organic semiconductor material a, for example, polystyrenes are used favorably. Furthermore, it is preferable that the weight average molecular weight of the polymer material b is about 10,000 to 500,000 from the viewpoint of facilitation of phase separation.

Solvent c

It is preferable that the solvent c is a high-boiling point solvent having a low drying rate in printing. In addition, it is preferable that the solvent c is a solvent which dissolves the organic semiconductor material a and the polymer material b sufficiently and which has high dispersibility of the fine particle material described below. In the case where TIPS pentacene is used as the organic semiconductor material a and a polystyrene is used as the polymer material b, tetralin having high solubility of them and serving as a high-boiling point solvent is used preferably.

Fine Particle Material d

The fine particle material d is added to control the viscosity and the thixotropy of the ink for printing, and inorganic fine particles, organic fine particles, or the like are used.

As for the inorganic fine particles, silica, alumina, titanium oxide, magnesium oxide, zinc oxide, zirconium oxide, silicon nitride, potassium titanate, barium titanate, calcium carbonate, aluminum carbonate, aluminum silicate, magnesium silicate, aluminum borate, glass, and the like are used.

The organic fine particles may be organic fine particles of polystyrenes, polyethylenes, polypropylenes, acrylic, e.g., polymethyl methacrylates, polycarbonates, polyimides, polyamides, polyurethanes, polyesters, polyvinyl chlorides, polyacrylonitriles, polyvinyl toluenes, melamine resins, silicone resins, epoxy resins, and the like, fine particles of copolymers thereof, and mixtures of at least two types thereof.

Furthermore, the above-described fine particle material d may be in the shape of a sphere or other shapes, and it is preferable that the average particle diameter is about 5 to 1,000 nm from the viewpoint of the dispersibility. This fine particle material d may be formed from an insulating material or may be a semiconductor fine particles. Preferably, the fine particle material d is used in such a way that the volume ratio becomes 50% or less in the semiconductor composite film formed here.

Moreover, in the case where it is desirable that the fine particle material d is transferred to the surface side in the phase separation of the organic semiconductor material a and the polymer material b conducted thereafter, it is enough that a modification group having low surface energy is provided on the surface of the fine particle material d formed from the above-described material and the resulting fine particle material d is used.

The above-described individual materials are mixed and agitated sufficiently, so that the ink 3 for printing is prepared. This ink 3 has the viscosity and the thixotropy controlled by the amount of dispersion of the fine particle material d.

Figure 1B:
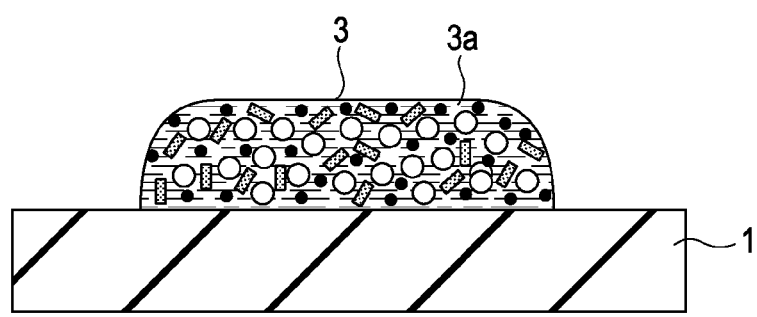

Next, as shown in FIG. 1B, in the forming a semiconductor composite film, a printing method is executed in which the prepared ink 3 is used and, thereby, a material layer 3a is formed through pattern printing of the ink 3 on a substrate 1.

The printing method applied here is not specifically limited. Screen printing, gravure printing, flexographic printing, offset printing, gravure offset printing, or the like is applied and, thereby, high-throughput pattern printing is executed. The printing method may be pattern printing by an ink-jet method. Furthermore, the material layer 3a may be formed into the shape of a film on the substrate 1 by a coating and printing method.

As for the substrate 1 used here, a material, in which at least the side of the surface to be provided with the material layer 3a has the insulating property, is used. In addition, regarding the substrate 1, it is preferable that a material having higher affinity for the material (for example, the organic semiconductor material a) to be formed on the substrate 1 side in the following phase separation of the material layer 3a as compared with the affinity for the other material (for example, the polymer material b) is used.

As for such a substrate 1, besides a glass substrate, a plastic substrate of polyether sulfone (PES), polyethylene naphthalate (PEN), polyimide (PI), polycarbonate (PC), polyacrylate (PAR), polyether ether ketone (PEEK), polyphenylene sulfide (PPS), polyethylene terephthalate (PET), or the like is used. Furthermore, as for the substrate 1, a metal thin film substrate (metal foil) formed from stainless steel or the like may be used after the surface is subjected to an insulation treatment. Moreover, the substrate 1 may be subjected to an affinity treatment to obtain the above-described affinity.

As an example, in the case where TIPS pentacene is used as the organic semiconductor material a and polystyrene is used as the polymer material b, it is preferable that a substrate formed from polyether sulfone (PES) or the like is used as the substrate 1.

Figure 1C:
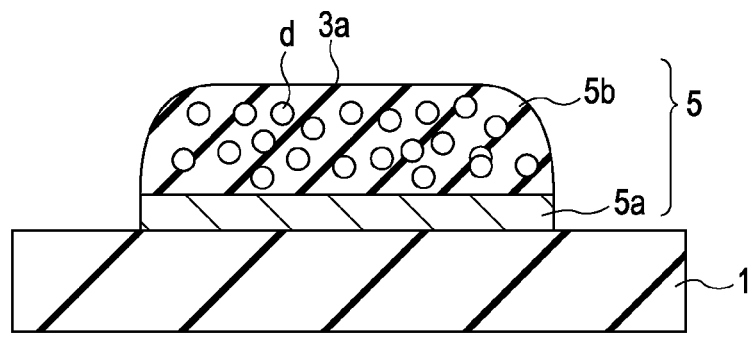

Thereafter, as shown in FIG. 1C, in the forming a semiconductor composite film, the solvent c in the material layer 3a is removed. According to this, the material layer 3a is solidified and, in addition, the organic semiconductor material a and the polymer material b in the material layer 3a are phase-separated in the film thickness direction. Consequently, the material layer 3a is converted to a semiconductor composite film 5 in which a semiconductor thin film layer 5a containing the organic semiconductor material a and an insulating thin film layer 5b containing the polymer material b are laminated. In this semiconductor composite film 5, the fine particle material d is dispersed.

Here, for example, it is enough that the substrate 1 is subjected to a heat treatment at an appropriate temperature depending on the solvent c. According to this, the solvent c is removed while the organic semiconductor material a and the polymer material b are phase-separated in the material layer 3a.

For example, in the case where tetralin is used as the solvent c, a heat treatment is conducted at 100° C. for 2 hours and, thereby, the solvent c is removed from the material layer 3a. At this time, the material layer 3a is solidified due to removal of the solvent c and, in addition, the organic semiconductor material a having high affinity for the substrate 1 is phase-separated to the substrate 1 side in the film thickness direction and the polymer material b having low affinity for the substrate 1 is phase-separated to the surface side of the material layer 3a in the film thickness direction. Consequently, the semiconductor thin film layer 5 is formed, in which the semiconductor thin film layer 5a containing the organic semiconductor material a is formed on the substrate 1 side and the insulating thin film layer 5b containing the polymer material b is laminated thereon.

In this regard, the fine particle material d in the material layer 3a comes into the state of being dispersed in the semiconductor composite film 5. At this time, in the case where a modification group having low surface energy is provided on the surface of the fine particle material d, the fine particle material d moves to the vicinity of the surface of the material layer 3a during this heat treatment. Consequently, the fine particle material d comes into the state of being dispersed primarily in the insulating thin film layer 5b. In the case where an insulating fine particle material d is used, the insulating property of the insulating thin film layer 5b is not hindered, nor are the semiconductor characteristics of the semiconductor thin film layer 5a hindered.

The thus formed semiconductor composite film 5 has a configuration in which the insulating thin film layer 5b serving as a protective film is formed on the semiconductor thin film layer 5a in a self aligning manner. In this regard, the total film thickness of the semiconductor composite film 5 after the phase separation is within the range of 0.1 to 20.0 μm, although depending on the printing condition and the solid concentration in the ink 3.

In the above-described method for forming the semiconductor composite film 5, printing is conducted by preparing the ink 3 in which the fine particle material d is dispersed in the solvent c in addition to the organic semiconductor material a and the polymer material b. Consequently, content ratio of the semiconductor material a to the polymer material b may be determined in consideration of the phase separation property and the film characteristics without considering the printability. Therefore, the viscosity and the thixotropy of the ink for film formation can be controlled favorably by the amount of the dispersion of the fine particle material.

In this manner, the semiconductor composite film 5 can be obtained, in which the semiconductor material a and the polymer material b are reliably phase-separated in the material layer 3a formed through printing with good precision of shape while having the viscosity and the thixotropy for good printability.

In the past, only the ink-jet method suitable for a low-viscosity ink has been applicable to the printing system of a low-molecular organic semiconductor material exhibiting high mobility. However, according to an embodiment of the present invention, printing by various printing systems, e.g., screen printing, gravure printing, flexographic printing, offset printing, and furthermore, gravure offset printing, in which still higher viscosity and the thixotropy have been desired, can be employed. Therefore, an improvement of throughput and a reduction in costs can be realized in the pattern printing of the semiconductor composite film 5.

Moreover, in a printing method in which a high viscosity ink can be used as compared with that in the above-described ink-jet method, the content ratio of polymer material in the ink can be increased within the bounds of effecting phase separation. According to this, it is possible to increase the film thickness of the insulating thin film layer 5b. Specifically, the film thickness of the insulating thin film layer formed by the polymer blend method, to which the ink-jet method is applied, in the related art is about 100 nm. On the other hand, the film thickness of the insulating thin film layer formed by applying the above-described printing method in which a high viscosity ink can be used is 1 μm or more. Therefore, the insulating thin film layer 5b can be used as the protective film of the semiconductor thin film layer 5a and the semiconductor thin film layer 5a and the protective film (insulating thin film layer 5b) can be formed in one operation by applying the above-described printing method.

In addition, in the case where the fine particle material d formed from the insulating material is dispersed in the insulating thin film layer 5b, the film thickness of the insulating thin film layer 5b can be increased by the content of the fine particle material d.

Thin Film Transistor 1

The embodiment of a bottom gate structure (staggered type) thin film transistor, to which the above-described method for forming a semiconductor composite film is applied, will be described below with reference to FIGS. 2A to 2C.

Figure 2A:
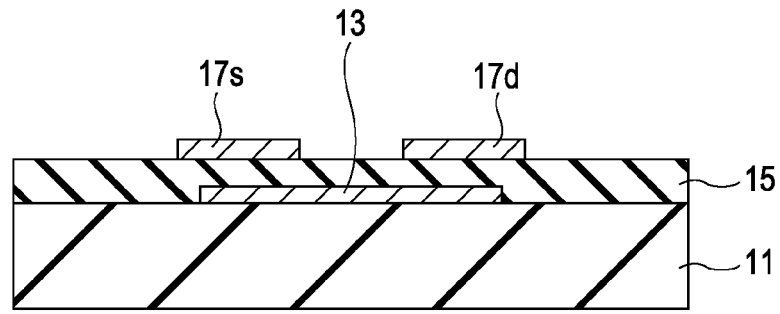
FIGS. 2A to 2C are diagrams for explaining an example of a production procedure of a thin film transistor according to an embodiment of the present invention.

Initially, as shown in FIG. 2A, a substrate 11 is prepared and a gate electrode 13 is patterned thereon.

Regarding the substrate 11 used here, it is desired that at least the side of the surface to be provided with the gate electrode 13 has the insulating property, and besides a glass substrate, a plastic substrate of polyether sulfone (PES), polyethylene naphthalate (PEN), polyimide (PI), polycarbonate (PC), polyacrylate (PAR), polyether ether ketone (PEEK), polyphenylene sulfide (PPS), polyethylene terephthalate (PET), or the like is used. Furthermore, as for the substrate 11, a metal thin film substrate (metal foil) formed from stainless steel or the like may be used after the surface is subjected to an insulation treatment.

Patterning of the gate electrode 13 on the above-described substrate 11 is conducted as described below, for example. First, an electrically conductive ink including silver fine particles having an average particle diameter of 10 nm is applied by, for example, a die coating method to the plastic substrate 11 formed from polyether sulfone (PES) Thereafter, a heat treatment is conducted at 150° C. for 1 hour, so that an electrically conductive film having a film thickness of 50 nm is formed from silver. Subsequently, a resist pattern in a desired shape is formed on the electrically conductive film through screen printing. Then, the gate electrode 13 is formed by patterning the electrically conductive film through wet etching of the electrically conductive film by using a silver etching solution and a resist pattern serving as a mask. After formation of the gate electrode 13, the resist ink is removed.

In the above-described formation of the gate electrode 13, the resist pattern used as the mask in the wet etching of the electrically conductive film may be formed by using an ink-jet method, a photolithography method, an offset printing method, or a laser drawing method. Furthermore, as for the formation of the gate electrode 13, an electrically conductive ink may be directly patterned by an ink-jet method, a screen printing method, a microcontact printing method, a flexographic printing method, a gravure printing method, or an offset printing method. However, in order to ensure good insulating characteristic with respect to a gate insulating film disposed while covering the gate electrode 13 in the following step, it is preferable that the surface of the gate electrode 13 is flat and the film thickness is minimized to 100 nm or less.

Moreover, the gate electrode 13 is not limited to that formed by using silver. A metal, e.g., gold, platinum, palladium, copper, nickel, or aluminum, or an electrically conductive organic material formed from poly(3,4-ethylenedioxythiophene)/poly(4-styrenesulfonate) (PEDOT/PSS) or polyaniline (PANI) can also be used.

Thereafter, a gate insulating film 15 is formed while covering the gate electrode 13. Regarding the gate insulating film 15 used here, it is preferable that a material having higher affinity for the material (for example, the organic semiconductor material) to be formed on the gate insulating film 15 side in phase separation of the material layer in a step conducted thereafter as compared with the affinity for the other materials (for example, the polymer material) is used.

The formation of the above-described gate insulating film 15 is conducted by, for example, a die coating method. Here, as an example, a solution in which 10 percent by weight of polymer material, polyvinyl phenol (PVP), and a cross-linking agent, poly(melamine-co-formaldehyde), are dissolved into propylene glycol monomethyl ether acetate (PGMET) is prepared. The resulting solution is applied to the substrate 11 provided with the gate electrode 13, a heat treatment is conducted at 180° C. for 1 hour, so that the gate insulating film 15 is formed. It is desirable that the gate insulating film 15 is formed having a film thickness of 1 μm or less and a flat surface for the purpose of low voltage operation of a transistor.

In this regard, besides the die coating method, other coating methods, e.g., a gravure coating method, a roll coating method, a kiss coating method, a knife coating method, a slit coating method, a blade coating method, a spin coating method, and an ink-jet coating method, can be used for formation of the gate insulating film 15. As for the material for forming the gate insulating film 15, polyimides, polyamides, polyesters, polyacrylates, polyvinyl alcohols, epoxy resins, novolac resins, and the like can be used besides PVP.

Then, a source electrode 17s and a drain electrode 17d are patterned on the gate insulating film 15. These source electrode 17s and drain electrode 17d are formed while the ends are opposed to each other above the gate electrode 13 with the gate insulating film 15 therebetween.

The above-described source electrode 17s and drain electrode 17d are formed in the same manner as that of, for example, the gate electrode 13. That is, initially, a silver ink is applied uniformly by a die coating method, and then, a heat treatment is conducted at 150° C., so that an electrically conductive film having a film thickness of 50 nm is formed from silver. Thereafter, a resist ink is patterned on the electrically conductive film by a screen printing method. Subsequently, the source electrode 17s and the drain electrode 17d are formed by patterning the electrically conductive film through etching of the electrically conductive film by using a silver etching solution and a resist pattern serving as a mask. After formation of the source electrode 17s and the drain electrode 17d, the resist ink is removed.

Here, as for the source electrode 17s and the drain electrode 17d, besides silver, a metal, e.g., gold, platinum, palladium, copper, or nickel, which come into good ohmic contact with p-type semiconductors, or an electrically conductive organic material formed from poly(3,4-ethylenedioxythiophene)/poly(4-styrenesulfonate) (PEDOT/PSS) or polyaniline (PANI) can also be used.

Furthermore, in the formation of the source electrode 17s and the drain electrode 17d, the resist pattern used in the wet etching of the electrically conductive film may be formed by using an ink-jet method, a photolithography method, or a laser drawing method. Furthermore, as for the formation of the source electrode 17s and the drain electrode 17d, the pattern may be directly formed by an ink-jet method, a screen printing method, a microcontact printing method, or an offset printing method.

In this regard, as for the source electrode 17s and the drain electrode 17d, it is preferable that a material having higher affinity for the material (for example, the organic semiconductor material) to be formed on the gate insulating film 15 side and the source electrode 17s and drain electrode 17d side in phase separation of the material layer in a step conducted thereafter as compared with the affinity for the other materials (for example, the polymer material) is used.

Figure 2B:
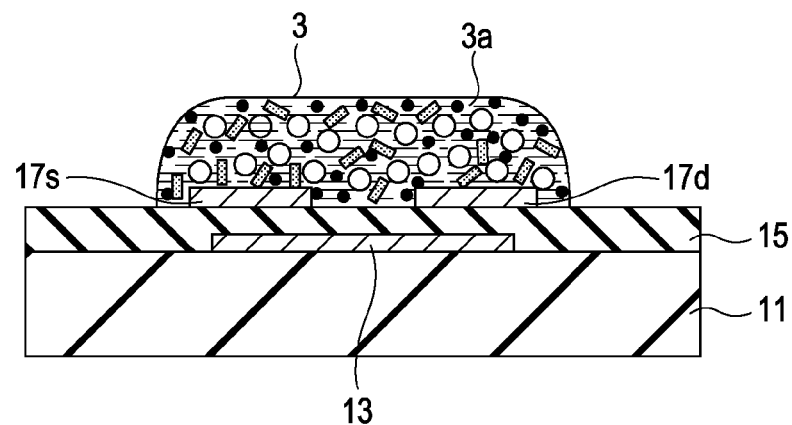

Thereafter, as shown in FIG. 2B, the gate electrode 13 and the source electrode 17s and the drain electrode 17d formed thereon are allowed to serve as a substrate, and a material layer 3a is pattern-printed on the substrate by using an ink. The ink used here is the same as that explained in the above-described method for forming a semiconductor composite film and is a printing ink 3 in which an organic semiconductor material a and a polymer material b are dissolved into a solvent c and, in addition, a fine particle material d is dispersed into the solvent c.

The printing method applied to the pattern printing of the material layer 3a by using this ink 3 is not specifically limited. The pattern printing is conducted in such a way that the material layer 3a is disposed over at least from the source electrode 17s to the drain electrode 17d. Furthermore, in the case where screen printing, gravure printing, or the like is applied to this pattern printing, high-throughput pattern printing is conducted. Moreover, the pattern printing may be conducted by an ink-jet method. In addition, for example, in the case where the element isolation is not necessary, the material layer 3a may be formed into the shape of a film by a coating printing method.

Figure 2C:
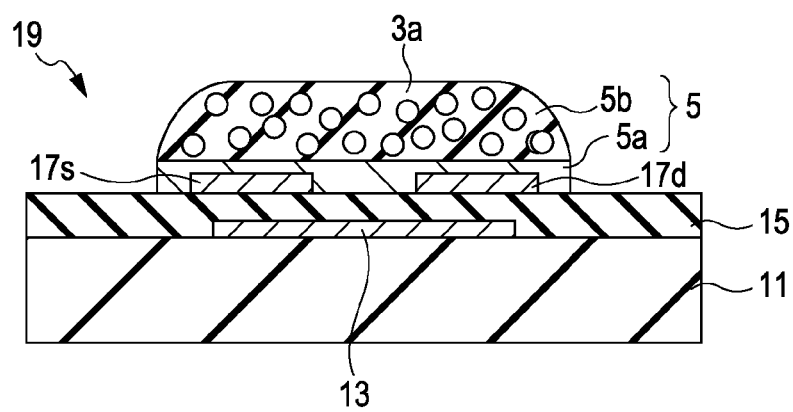

Subsequently, as shown in FIG. 2C and as described above in the method for forming a semiconductor composite film, the solvent c in the material layer 3a is removed, the material layer 3a is solidified and, in addition, the organic semiconductor material a and the polymer material b in the material layer 3a are phase-separated in the film thickness direction.

In this manner, as described above, the organic semiconductor material a having high affinity for the gate insulating film 15 serving as the substrate and the source electrode 17s and the drain electrode 17d is phase-separated to the substrate side in the film thickness direction and the polymer material b having low affinity therefor is phase-separated to the surface side of the material layer 3a in the film thickness direction. Consequently, the semiconductor thin film layer 5 is formed, in which the semiconductor thin film layer 5a containing the organic semiconductor material a is formed while being in contact with the source electrode 17s, the drain electrode 17d, and the gate insulating film 15 between them, and the insulating thin film layer 5b containing the polymer material b is laminated thereon.

The fine particle material d in the material layer 3a comes into the state of being dispersed in the semiconductor composite film 5. At this time, in the case where a modification group having low surface energy is provided on the surface of the fine particle material d, the fine particle material d moves to the vicinity of the surface of the material layer 3a during this heat treatment. Consequently, the fine particle material d comes into the state of being dispersed primarily in the insulating thin film layer 5b.

In this manner, a bottom gate structure (staggered type) thin film transistor 19 is obtained. The resulting thin film transistor 19 is of bottom gate-bottom contact type. In the resulting semiconductor composite film 5, the semiconductor thin film layer 5a in contact with the source electrode 17s, the drain electrode 17d, and the gate insulating film 15 between them serves as a channel formation region.

In the above-described embodiment, the method for forming a semiconductor composite film 5 explained above with reference to FIG. 1 is applied and, thereby, the semiconductor composite film 5 is formed on the source electrode 17s and the drain electrode 17d through pattern printing. Therefore, regarding the semiconductor composite film 5, as described above, the semiconductor material a and the polymer material b are reliably phase-separated in the material layer 3a formed through printing with good precision of shape while having the viscosity and the thixotropy for good printability.

In the past, only the ink-jet method suitable for a low-viscosity ink has been applicable to the printing system of a low-molecular organic semiconductor material exhibiting high mobility. However, according to an embodiment of the present invention, printing by various printing systems, e.g., screen printing and gravure offset printing, in which still higher thixotropy has been desired, can be employed. Therefore, an improvement of throughput and a reduction in costs can be realized in the pattern printing of the semiconductor composite film 5.

Furthermore, as described above, the film thickness of the insulating thin film layer 5b can be increased to 1 μm or more by dispersing the fine particle material d formed from the insulating material into the insulating thin film layer 5b. Therefore, the insulating thin film layer 5b can be used as the protective film of the semiconductor thin film layer 5a, and the semiconductor thin film layer 5a and the protective film (insulating thin film layer 5b) can be formed in one operation.

In this regard, in the case where the fine particle material d formed from the insulating material is dispersed into the insulating thin film layer 5b, this fine particle material d does not hinder the semiconductor characteristics of the semiconductor thin film layer 5a, nor hinder the carrier transit.

Thin Film Transistor 2

The embodiment of a top gate structure (inverted staggered type) thin film transistor, to which the above-described method for forming a semiconductor composite film is applied, will be described below with reference to FIGS. 3A to 3D.

Figure 3A:
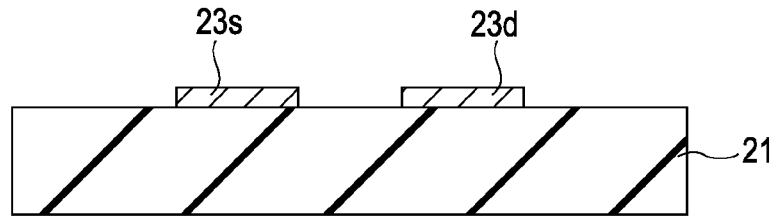
FIGS. 3A to 3D are diagrams for explaining another example of a production procedure of a thin film transistor according to an embodiment of the present invention.

Initially, as shown in FIG. 3A, a substrate 21 is prepared and a source electrode 23s and a drain electrode 23d are patterned thereon.

Regarding the substrate 21 used here, a material, in which at least the side of the surface to be provided with the material layer 3a has the insulating property, is used. In addition, regarding the substrate 21, it is preferable that a material having higher affinity for the material (for example, the organic semiconductor material a) to be formed on the substrate 21 side in the following phase separation of the material layer 3a as compared with the affinity for the other material (for example, the polymer material b) is used.

As for such a substrate 21, the same substrate as those described in the formation of the semiconductor composite film are used. That is, besides a glass substrate, a plastic substrate of polyether sulfone (PES), polyethylene naphthalate (PEN), polyimide (PI), polycarbonate (PC), polyacrylate (PAR), polyether ether ketone (PEEK), polyphenylene sulfide (PPS), polyethylene terephthalate (PET), or the like is used. Furthermore, as for the substrate 21, a metal thin film substrate (metal foil) formed from stainless steel or the like may be used after the surface is subjected to an insulation treatment. Moreover, the substrate 21 may be subjected to an affinity treatment to obtain the above-described affinity.

Patterning of the source electrode 23s and the drain electrode 23d on the above-described substrate 21 is conducted in a manner similar to that in the formation of the source electrode 17s and the drain electrode 17d in production of the above-described bottom gate structure (staggered type) thin film transistor 19. That is, an electrically conductive ink including silver fine particles having an average particle diameter of 10 nm is applied. Thereafter, a heat treatment is conducted at 150° C. for 1 hour, so that an electrically conductive film having a film thickness of 50 nm is formed from silver. Subsequently, a resist pattern in a desired shape is formed on the electrically conductive film through screen printing. Then, the source electrode 23s and the drain electrode 23d are formed by patterning the electrically conductive film through wet etching of the electrically conductive film by using a silver etching solution and a resist pattern serving as a mask.

Figure 3B:
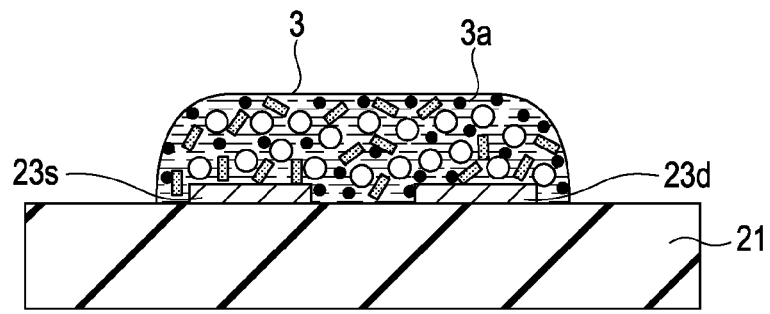

Thereafter, as shown in FIG. 3B, the substrate 21 and the source electrode 23s and the drain electrode 23d formed thereon are allowed to serve as a substrate, and a material layer 3a is pattern-printed on the substrate by using an ink. The ink used here is the same as that explained in the above-described method for forming a semiconductor composite film and is a printing ink 3 in which an organic semiconductor material a and a polymer material b are dissolved into a solvent c and, in addition, a fine particle material d is dispersed into the solvent c. However, it is preferable that the fine particle material d used here has an insulating property.

The printing method applied to the pattern printing of the material layer 3a by using this ink 3 is not specifically limited. As in the above-described example, the pattern printing is conducted in such a way that the material layer 3a is disposed over at least from the source electrode 23s to the drain electrode 23d. Furthermore, in the case where screen printing, gravure printing, or the like is applied to this pattern printing, high-throughput pattern printing is conducted. Moreover, the pattern printing may be conducted by an ink-jet method. In addition, for example, in the case where the element isolation is not necessary, the material layer 3a may be formed into the shape of a film by a coating printing method, as in the above-described example.

Figure 3C:
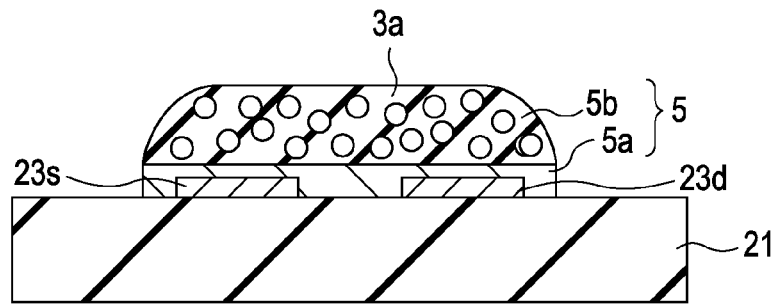

Subsequently, as shown in FIG. 3C and as described above in the method for forming a semiconductor composite film, the solvent c in the material layer 3a is removed, the material layer 3a is solidified and, in addition, the organic semiconductor material a and the polymer material b in the material layer 3a are phase-separated in the film thickness direction.

In this manner, as described above, the organic semiconductor material a having high affinity for the substrate 21 serving as the substrate and the source electrode 23s and the drain electrode 23d is phase-separated to the substrate side in the film thickness direction and the polymer material b having low affinity therefor is phase-separated to the surface side of the material layer 3a in the film thickness direction. Consequently, the semiconductor composite film 5 is formed, in which the semiconductor thin film layer 5a containing the organic semiconductor material a is formed while being in contact with the source electrode 23s and the drain electrode 23d and the insulating thin film layer 5b containing the polymer material b and serving as the gate insulating film is laminated thereon.

The fine particle material d in the material layer 3a comes into the state of being dispersed in the semiconductor composite film 5. At this time, in the case where a modification group having low surface energy is provided on the surface of the fine particle material d, the fine particle material d moves to the vicinity of the surface of the material layer 3a during the heat treatment. Consequently, the fine particle material d comes into the state of being dispersed primarily in the insulating thin film layer 5b.

Figure 3D:
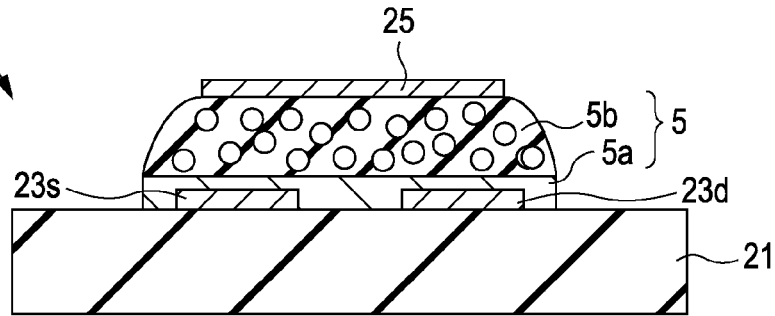

Thereafter, as shown in FIG. 3D, a gate electrode 25 is patterned on the semiconductor composite film 5.

The patterning of the gate electrode 25 on the above-described semiconductor composite film 5 is conducted by, for example, an ink-jet method. At this time, for example, an electrically conductive ink including silver fine particles having an average particle diameter of 10 nm is used and the electrically conductive ink is pattern-printed into a desired shape. Thereafter, a heat treatment is conducted at 120° C. for 2 hours, so that the gate electrode 25 is formed from silver.

Regarding the above-described formation of the gate electrode 25, it is preferable to apply a method for directly patterning the electrically conductive ink, for example, a screen printing method, a microcontact printing method, a flexographic printing method, a gravure printing method, or an offset printing method, besides the ink-jet method. Moreover, the gate electrode 25 is not limited to that formed by using silver. A metal, e.g., gold, platinum, palladium, copper, nickel, or aluminum, or an electrically conductive organic material formed from poly(3,4-ethylenedioxythiophene)/poly(4-styrenesulfonate) (PEDOT/PSS) or polyaniline (PANI) can also be used.

In this manner, a top gate structure (inverted staggered type) thin film transistor 29 is obtained. The resulting thin film transistor 29 is of top gate-bottom contact type. In the resulting semiconductor composite film 5, the semiconductor thin film layer 5a in contact with the source electrode 23s and the drain electrode 23d serves as a channel formation region. On the other hand, the insulating thin film layer 5b on this semiconductor thin film layer 5a serves as the gate insulating film.

In the above-described embodiment as well, the method for forming a semiconductor composite film 5 explained above with reference to FIG. 1 is applied and, thereby, the semiconductor composite film 5 is formed on the source electrode 23s and the drain electrode 23d through pattern printing. Therefore, regarding the semiconductor composite film 5, in the same manner as that described above, the semiconductor material a and the polymer material b are reliably phase-separated in the material layer 3a formed through printing with good precision of shape while having the viscosity and the thixotropy for good printability.

In the past, only the ink-jet method suitable for a low-viscosity ink has been applicable to the printing system of a low-molecular organic semiconductor material exhibiting high mobility. However, according to an embodiment of the present invention, printing by various printing systems, e.g., screen printing and gravure offset printing, in which still higher thixotropy has been desired, can be employed. Therefore, an improvement of throughput and a reduction in costs can be realized in the pattern printing of the semiconductor composite film 5.

Furthermore, as described above, the film thickness of the insulating thin film layer 5b can be increased to 1 μm or more by dispersing the fine particle material d formed from the insulating material into the insulating thin film layer 5b. Therefore, the insulating thin film layer 5b can be used as the protective film of the semiconductor thin film layer 5a, and the semiconductor thin film layer 5a and the protective film (insulating thin film layer 5b) can be formed in one operation.

In this regard, in the case where the fine particle material d formed from the insulating material is dispersed into the insulating thin film layer 5b, this fine particle material d does not hinder the semiconductor characteristics of the semiconductor thin film layer 5a, nor hider the carrier transit, as in the above-described embodiment.

Electronic Apparatus

Figure 4:
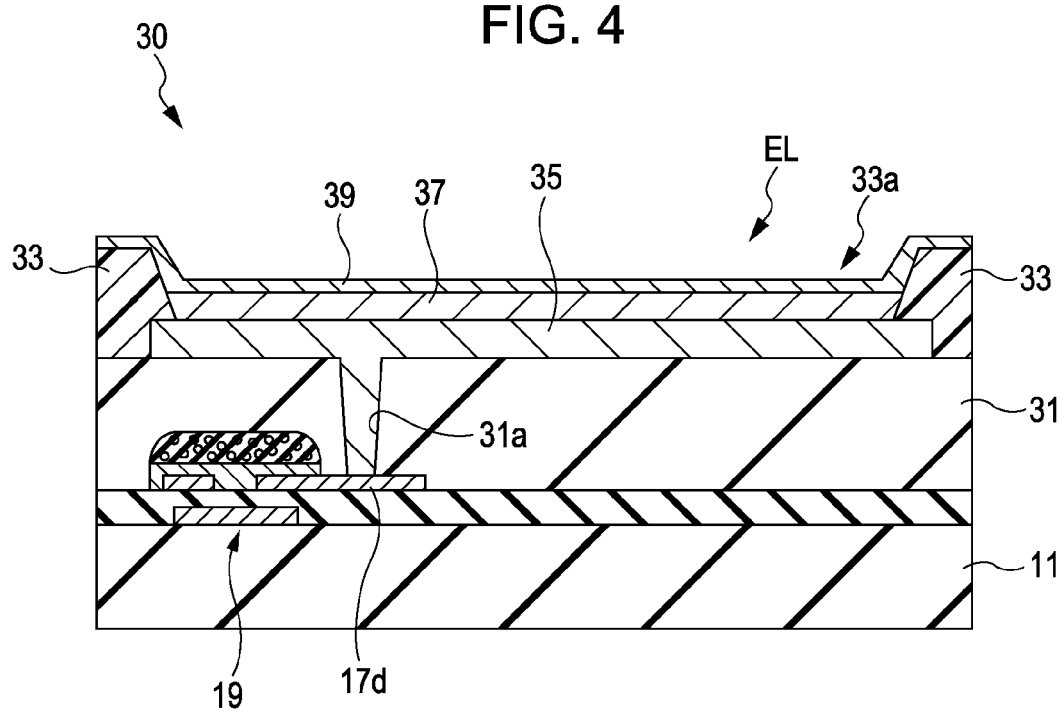
FIG. 4 is a diagram for explaining an example of an electronic apparatus according to an embodiment of the present invention.
Figure 5:
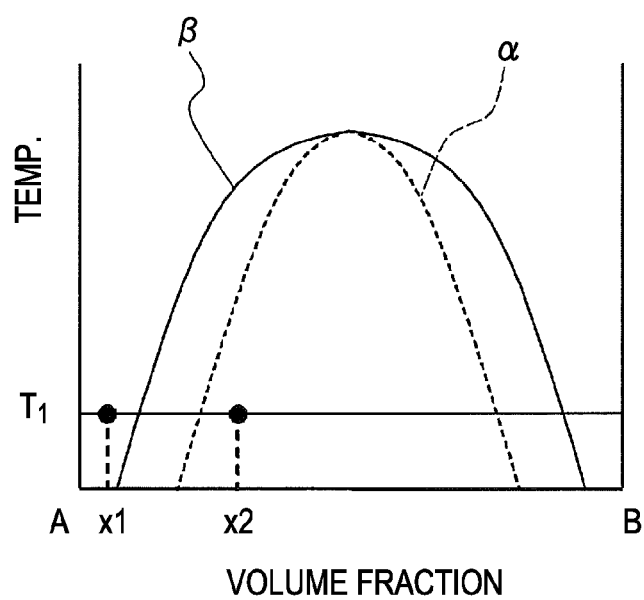
FIG. 5 is a binary diagram of a polymer alloy.

FIG. 4 shows an example of an electronic apparatus provided with the above-described semiconductor composite film 5. This electronic apparatus is an organic EL display 30 and includes a thin film transistor formed by using the above-described semiconductor composite film 5 in a drive circuit. The thin film transistor may be, for example, the bottom gate type thin film transistor 19 explained with reference to FIG. 2 or the top gate type thin film transistor 29 explained with reference to FIG. 3. Here, for example, the configuration including the bottom gate type thin film transistor 19 explained with reference to FIG. 2 is shown in the drawing.

The organic EL display 30 shown in FIG. 4 has the following configuration.

That is, for example, the bottom gate type thin film transistor 19 explained with reference to FIG. 2 is disposed on the surface side of a substrate 11, and an interlayer insulating film 31 is disposed while covering this. A connection hole 31a reaching a drain electrode 17d of the drain electrode 19 is disposed in the interlayer insulating film 31.

An organic electroluminescence element EL connected to the drain electrode 17d of the organic thin film transistor 19 through the connection hole 31a is disposed in each pixel on the interlayer insulating film 31. This organic electroluminescence element EL is element-isolated with an insulating pattern 33 disposed on the interlayer insulating film 31.

The organic electroluminescence element EL includes a pixel electrode 35 formed from an electrically conductive pattern connected to the drain electrode 17d of the organic thin film transistor 19. This pixel electrode 35 is patterned on a pixel basis so as to be used as, for example, a positive electrode and has the light reflecting property.

The outer edge of this pixel electrode 35 is covered with the insulating pattern 33 for element-isolating the organic electroluminescence element EL. This insulating pattern 33 is provided with an open window 33a for exposing the pixel electrode 35 widely. This open window 33a serves as a pixel opening of the organic electroluminescence element EL. The above-described insulating pattern 33 is formed by using, for example, a photosensitive resin and is patterned by applying a lithography method.

An organic layer 37 is disposed while covering the pixel electrode 35 exposed at the above-described insulating pattern 33. This organic layer 37 has a lamination structure provided with at least an organic light-emitting layer, and is formed by laminating a hole injection layer, a hole transporting layer, an organic light-emitting layer, an electron transporting layer, an electron injection layer, and other layers, as necessary, in that order from the positive electrode (here, pixel electrode 35) side. In this regard, the organic layer 37 is patterned in such a way that the configuration is different, for example, on a wavelength of the light emitted from an organic electroluminescence element EL basis, and at least a layer including the organic light-emitting layer is different on a pixel basis. Furthermore, a layer common to pixels with individual wavelengths may be included. Moreover, in the case where this organic electroluminescence element EL is configured to serve as a fine resonator structure, it is desirable that the film thickness of the organic layer 37 is adjusted in accordance with the wavelength taken from each organic electroluminescence element EL.

A common electrode 39 is disposed while covering the above-described organic layer 37 and holding the organic layer 37 between the pixel electrode 35 and the common electrode 39. This common electrode 39 is an electrode on the side of taking the light emitted from the organic light-emitting layer of the organic electroluminescence element EL and is formed from a material exhibiting the light transmission property. In addition, since the pixel electrode 35 functions as a positive electrode here, this common electrode 39 is formed by using a material in which at least the side in contact with the organic layer 37 functions as a negative electrode. Furthermore, in the case where this organic electroluminescence element EL is configured to serve as a fine resonator structure, it is desirable that this common electrode 39 is configured to exhibit the transflective property.

Then, each pixel portion, in which the organic layer 37 is held between the pixel electrode 35 and the common electrode 39, as described above, functions as the organic electroluminescence element EL.

Although not shown in the drawing here, the organic EL display 30 has the configuration in which the side provided with the individual organic electroluminescence elements EL is covered with a seal resin formed from a light-transmissive material and is bonded to the counter substrate formed from a light-transmissive material with the above-described seal resin therebetween.

Incidentally, in the above-described embodiment, an active matrix type display including the organic electroluminescence element EL is exemplified as an example of an electronic apparatus provided with the bottom gate-bottom contact structure thin film transistor 19 explained with reference to FIG. 2. However, the electronic apparatus according to an embodiment of the present invention can be widely applied to electronic apparatuses including thin film transistors. For example, regarding displays, it is possible to apply to flexible displays, such as liquid crystal displays. Besides the displays, it is possible to apply to electronic apparatuses, e.g., ID tags and sensors, and similar effects can be exerted.

EXAMPLES

The bottom gate type thin film transistor 19 explained with reference to FIG. 2 was produced as described below.

On the other hand, a gate electrode 13 was formed by patterning an electrically conductive film formed from silver on a substrate 11 formed from polyether sulfone (PES). A gate electrode 15 was formed from PVP while covering the gate electrode 13. Furthermore, a source electrode 17s and a drain electrode 17d were formed thereon by patterning an electrically conductive film formed from silver.

On the other hand, an ink used for pattern-printing a material layer 3a was prepared as described below. Initially, 20 parts by weight of polystyrene having a weight average molecular weight of 50,000 and serving as a polymer material b and 5 parts by weight of 6,13-bis(triisopropyl-silylethinyl) pentacene (TIPS pentacene) serving as an organic semiconductor material a were added to 80 parts by weight of tetralin serving as a high-boiling point solvent and agitation was conducted sufficiently. Subsequently, an ink was prepared by adding and dispersing sufficiently a fine particle material d into the agitated solution to control the thixotropy.

In Example 1, 3 parts by weight of silica filler (R972: produced by NIPPON AEROSIL CO., LTD.) having an average primary particle diameter of 16 nm was added as the fine particle material d.

In Example 2, 3 parts by weight of styrene/acrylic fine particles having an average primary particle diameter of 100 nm was added as the fine particle material d.

In Comparative example, an ink was prepared without adding a fine particle material d.

Each ink prepared as described above was patterned through screen printing on the gate insulating film 15 provided with the source electrode 17s and the drain electrode 17d, so that a material layer 3a was obtained. The substrate 11 was subjected to a heat treatment at 100° C. for 2 hours and, thereby, the solvent in the material layer 3a was removed, solidification was effected, phase separation was facilitated, so that a semiconductor composite film 5 was produced.

Regarding the characteristic values of the thin film transistor 19 obtained as described above, (1) the mobility of the semiconductor thin film layer 5a constituting the semiconductor composite film 5, (2) the on/off ratio of current, (3) the threshold voltage were measured. The results thereof are shown in Table 1 described below.

TABLE 1

| | Fine particle material | Mobility ($cm^2/Vs$) | Current on/off ratio | Threshold voltage (V) |
|---|---|---|---|---|
| Example 1 | silica | $2.2 \times 10^{-2}$ | $2 \times 10^5$ | −1.2 |
| Example 2 | styrene/acrylic | $2.1 \times 10^{-2}$ | $1 \times 10^5$ | 0.7 |
| Comparative example | — | $2.5 \times 10^{-2}$ | $2 \times 10^5$ | 1.4 |

As is shown in Table 1, regarding both Examples 1 and 2, wherein the semiconductor thin film layers 5a were formed by using inks in which the fine particle materials d for controlling the viscosity and the thixotropy were dispersed, it was made clear that the thin film transistors having the characteristics at the same level as that of Comparative example in which the semiconductor thin film layer was formed without using a fine particle material were obtained. Consequently, it was ascertained that according to the application of the present invention, the semiconductor thin film layer 5a was able to be formed through reliable phase separation of the organic semiconductor material and the polymer material while the viscosity and the thixotropy were controlled and the pattern printing with good precision of shape was made possible.

The present application contains subject matter related to that disclosed in Japanese Priority Patent Application JP 2008-190602 filed in the Japan Patent Office on Jul. 24, 2008, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:
1. A thin film transistor comprising:
a gate insulating film on a surface of a substrate;
a gate electrode between the gate insulating film and the substrate;

a channel formation region comprising a semiconductor thin film layer on the gate insulating film, the semiconductor thin film layer being made of an organic semiconductor material;

an insulating thin film layer on the semiconductor thin film layer, the insulating film layer being made of a polymer material phase-separated from the organic semiconductor material in a film thickness direction; and a source electrode and a drain electrode between the semiconductor thin film layer and the gate insulating film, wherein, organic fine particles made of an insulating material are dispersed in the semiconductor thin film layer.

2. The thin film transistor according to claim 1, wherein the organic semiconductor material comprises a low-molecular material.

3. The thin film transistor according to claim 2, wherein,
the organic semiconductor material of the semiconductor thin film layer is phase-separated to a surface of the substrate, and
the polymer material of the insulating thin film layer is phase-separated to the surface of the semiconductor thin film layer facing away from the substrate.

4. The thin film transistor according to claim 3, wherein the affinity of the organic semiconductor material for the substrate is higher than the affinity of the polymer material for the substrate.

5. An electronic apparatus comprising a thin film transistor comprising:

a gate insulating film on a surface of a substrate;

a gate electrode between the gate insulating film and the substrate;

a channel formation region comprising a semiconductor thin film layer on the gate insulating film, the semiconductor thin film layer being made of an organic semiconductor material;

an insulating thin film layer on the semiconductor thin film layer, the insulating film layer being made of a polymer material phase-separated from the organic semiconductor material in a film thickness direction; and a source electrode and a drain electrode between the semiconductor thin film layer and the gate insulating film, wherein, organic fine particles made of an insulating material are dispersed in the semiconductor thin film layer.

* * * * *